(12) United States Patent
Kim et al.

(10) Patent No.: US 9,311,843 B2
(45) Date of Patent: Apr. 12, 2016

(54) IMAGE DISPLAY DEVICE

(71) Applicant: LG Electronics Inc., Seoul (KR)

(72) Inventors: Jaeho Kim, Seoul (KR); Jaehyun Sung, Seoul (KR); Kitae Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 71 days.

(21) Appl. No.: 14/319,425

(22) Filed: Jun. 30, 2014

(65) Prior Publication Data
US 2015/0130775 A1 May 14, 2015

(30) Foreign Application Priority Data

Nov. 13, 2013 (KR) .................. 10-2013-0137842

(51) Int. Cl.
*H04N 5/00* (2011.01)
*G09G 3/20* (2006.01)
*H05K 5/00* (2006.01)
*H05K 5/02* (2006.01)
*G06F 1/16* (2006.01)
*G09F 9/30* (2006.01)
*H04M 1/02* (2006.01)
*H04N 5/64* (2006.01)

(52) U.S. Cl.
CPC ............ *G09G 3/2085* (2013.01); *G06F 1/1652* (2013.01); *G09F 9/301* (2013.01); *H04M 1/0268* (2013.01); *H04N 5/64* (2013.01); *H05K 5/0017* (2013.01); *H05K 5/0217* (2013.01); *G09G 2300/04* (2013.01); *G09G 2380/02* (2013.01)

(58) Field of Classification Search
CPC ....... G06F 3/01; G06F 3/0488; G06F 1/1652; G09G 1/00; G09G 2320/0673; G09G 2360/16; G09G 2330/021
See application file for complete search history.

(56) References Cited

U.S. PATENT DOCUMENTS

| 2013/0169520 | A1* | 7/2013 | Cho ...................... G06F 3/0488 345/156 |
| 2014/0101560 | A1* | 4/2014 | Kwak ................... G06F 1/1652 715/738 |

FOREIGN PATENT DOCUMENTS

JP         2006023676 A        1/2006

* cited by examiner

*Primary Examiner* — Micheal Faragalla
(74) *Attorney, Agent, or Firm* — Dentons US LLP

(57) ABSTRACT

An image display device includes a flexible display unit transformable by a force between a first state and a second state having different curved degrees; a pressing member disposed at a rear surface of the flexible display unit, to apply the force to the flexible display unit; a driving unit to push or pull the pressing member such that a curved state of the pressing member is implemented; and an adjusting unit to couple the pressing member and the driving unit to each other, and movable with respect to the driving unit, the adjusting unit to adjust the curved state of the pressing member.

27 Claims, 7 Drawing Sheets

IMAGE DISPLAY DEVICE

CROSS-REFERENCE TO RELATED APPLICATION

Pursuant to 35 U.S.C. §119(a), this application claims the benefit of earlier filing date and right of priority to Korean Application No. 10-2013-0137842, filed on Nov. 13, 2013, the contents of which is incorporated by reference herein in its entirety.

BACKGROUND OF THE DISCLOSURE

1. Field of the Disclosure

The present disclosure relates to an image display device, and particularly, to an image display device having a flexible display unit.

2. Background of the Disclosure

In general, an image display device includes both a device of recording and/or reproducing images and a device of recording and/or reproducing audio. Examples of the image display device may include a TV set, a monitor, a projector, a tablet, a smart phone and the like.

As it becomes multifunctional, the image display device can be allowed to capture still images or moving images, play music or video files, play games, receive broadcasts and the like, so as to be implemented as an integrated multimedia player.

Many efforts are undergoing to support and enhance various functions such as a multimedia player in view of hardware or software improvements. Structural changes and improvements for simplifying an assembly structure of the image display device may be included in such attempts corresponding to the hardware improvement.

As an example of the structural changes and improvements, an image display device having a flexible display unit which is transformable in shape is being actively researched and proposed.

In such image display device, an initial curvature of the flexible display unit may be out of a preset range due to component tolerances and an assembly tolerance. Further, there is a limitation in compensating for a curvature range merely by a driving unit which generates a driving force for varying the shape of the flexible display unit.

SUMMARY OF THE DISCLOSURE

Therefore, an aspect of the detailed description is to provide an image display device capable of implementing a curvature of a flexible display unit, and capable of compensating for an initial curvature and a curvature range.

To achieve these and other advantages and in accordance with the purpose of this specification, as embodied and broadly described herein, there is provided an image display device, comprising: a flexible display unit formed to be transformable by an external force between a first state and a second state having different curved degrees; a pressing member mounted to a rear surface of the flexible display unit, and configured to apply an external force to the flexible display unit when curved; a driving unit configured to push or pull the pressing member such that a curved state of the pressing member is implemented; and an adjusting unit configured to connect the pressing member and the driving unit to each other, and movable close to or far from the driving unit such that the curved state of the pressing member is adjusted.

According to an embodiment of the present invention, the driving unit may include a driving motor configured to generate a rotational force at a driving shaft; a bevel gear configured to convert a direction of a driving force generated from the driving shaft; and a lead screw connected to the bevel gear to be rotated by operation of the driving motor, screw-coupled to the adjusting unit, and configured to move the adjusting unit close thereto or far therefrom according to its rotation direction.

The adjusting unit may include a body coupled to the pressing member and having an accommodation portion; and a screw nut partially or wholly inserted into the accommodation portion, screw-coupled to the lead screw, and configured to perform a relative motion with respect to the lead screw.

The screw nut may be provided with a manipulation portion configured to support one side surface of the body, the manipulation portion rotatably manipulated such that the screw nut performs a relative motion with respect to the lead screw.

The body may be formed to be slidable on a rear surface of the flexible display unit by a relative motion between the lead screw and the screw nut. A guide rail, configured to guide a sliding motion of the body by being inserted into a guide recess of the body, may be provided at a frame where the driving unit is mounted.

The adjusting unit may further include a fixing member detachably-coupled to the body, and configured to fix the screw nut when coupled to the body.

The fixing member may include a coupling portion configured to detachably-couple the fixing member to the body; an engaging portion engaged to at least part of the manipulation portion, such that the screw nut is prevented from being rotated when the coupling portion is coupled to the body; and a cover portion configured to cover one side of the manipulation portion when the coupling portion is coupled to the body, such that the screw nut is prevented from being separated from the accommodation portion.

According to another embodiment of the present invention, the image display device may further include an operation restricting unit configured to generate a signal for restricting an operation of the driving unit when the adjusting unit has moved more than a preset range by the operation of the driving unit.

The operation restricting unit may include a limit switch installed on a rear surface of the flexible display unit; and a clicker mounted to the adjusting unit, and configured to press the limit switch such that the signal is generated, if the adjusting unit has moved more than a preset range.

The limit switch may include a switch body; and an extended portion extended from the switch body in the form of a cantilever, and configured to generate the signal when grounded to the switch body by pressure of the clicker.

The clicker may be provided with a plurality of protruded portions protruding from an outer circumference of the clicker with different heights, and the clicker may be rotatably coupled to the adjusting unit such that one of the protruded portions presses the limit switch, if the adjusting unit has moved more than a preset range.

A plurality of fixing grooves configured to fix the clicker may be formed at the adjusting unit. And a plurality of fixing protrusions, configured to fix the clicker by being mounted to the fixing grooves, respectively, may be formed at the clicker.

The number of the fixing protrusions may be equal to the number of the protruded portions such that one of the plurality of protruded portions for pressing the limit switch is selectable while the clicker is rotated.

The operation restricting unit may further include an elastic member configured to press the clicker toward the adjusting unit, such that the plurality of fixing protrusions having been inserted into the plurality of fixing grooves, respectively are prevented from being separated from the fixing grooves.

The limit switch may be implemented as one of a first limit switch configured to contact the clicker when the adjusting unit moves close to the driving unit within a preset range, and a second limit switch configured to contact the clicker when the adjusting unit moves far from the driving unit out of a preset range.

The adjusting unit may be formed in plurality, and may be disposed on the right and left sides of the driving unit. The first limit switch may be installed to correspond to one of the plurality of adjusting units, and the second limit switch may be installed to correspond to another of the plurality of adjusting units.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

An image display device according to an embodiment of the present invention will now be given in detail with reference to the accompanying drawings.

For the sake of brief description with reference to the drawings, the same or equivalent components may be provided with the same reference numbers, and description thereof may not be repeated. A singular expression in this specification may include a plural meaning unless it is distinctively expressed. The suffixes attached to components, such as 'module' and 'unit or portion' are used for facilitation of the detailed description of the present disclosure. Therefore, the suffixes may not have different meanings from each other.

An image display device according to an embodiment of the present invention may include both a device of recording and/or reproducing images and a device for recording and/or reproducing audio by receiving and outputting broadcasts. Hereinafter, a TV as an example of the image display device will be illustrated.

Figure 1:
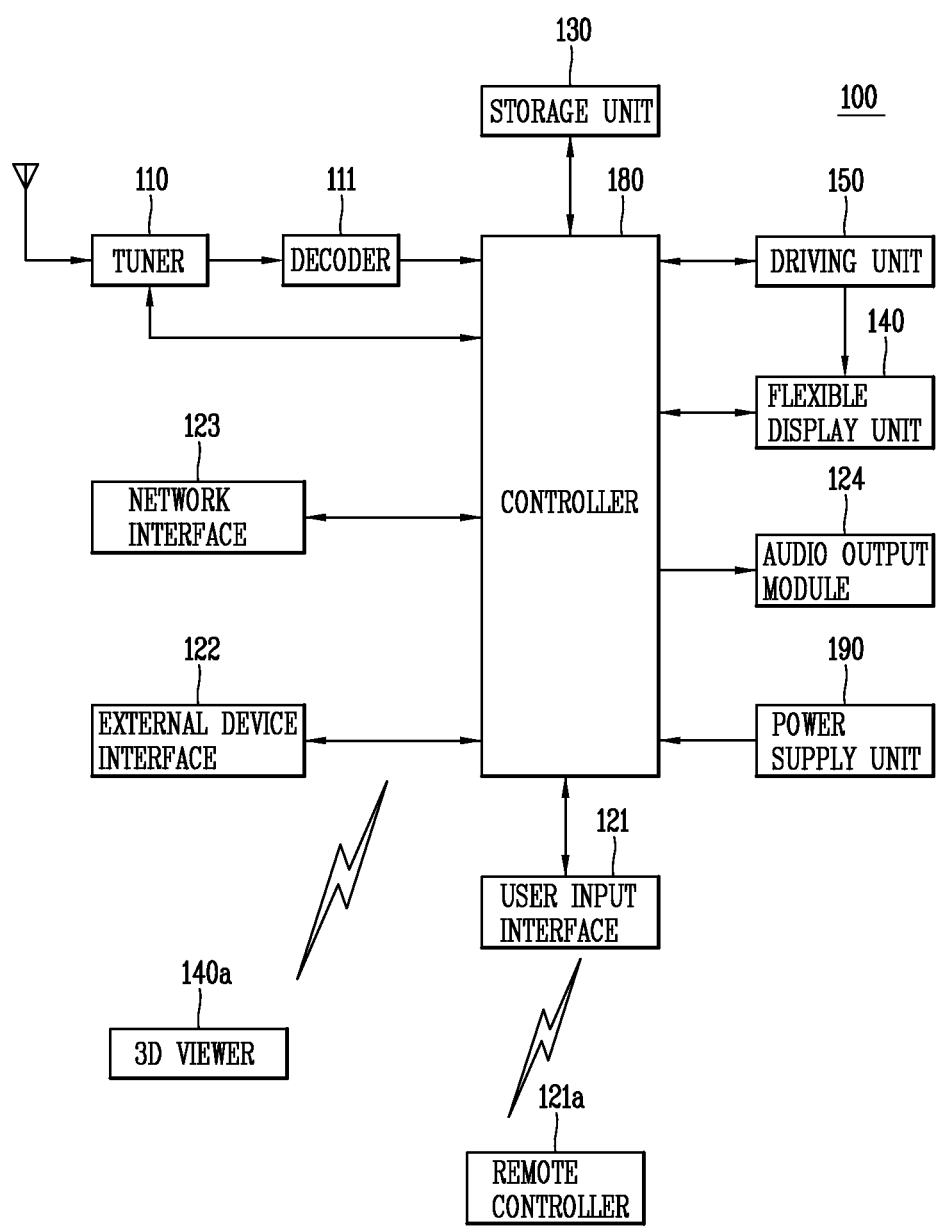
FIG. 1 is a block diagram illustrating an image display device and a remote controller according to an embodiment of the present invention.

FIG. 1 is a block diagram of an image display device 100 and a remote controller 121a according to an embodiment of the present invention.

As illustrated in FIG. 1, the image display device 100 may include a tuner 110, a decoder 111, an external device interface 122, a network interface 123, a storage unit 130, a user input interface 121, a controller 180, a flexible display unit 140, a driving unit 150, an audio output unit 124, a power supply unit 190, and a 3D viewer 140a.

The tuner 110 may select a radio frequency (RF) broadcast signal, which corresponds to a channel selected by a user, among RF broadcast signals received through an antenna, or every pre-stored channel. The tuner 110 may also convert the selected RF broadcast signal into a medium frequency signal or a baseband video or audio signal.

For example, when the RF broadcast signal selected is a digital broadcast signal, the tuner 110 may convert the RF broadcast signal into a digital intermediate frequency (IF) signal (DIF). On the other hand, when the RF broadcast signal is an analog broadcast signal, the tuner 110 may convert the RF broadcast signal into an analog baseband video or audio signal (CVBS/SIF). That is, the analog baseband image or audio signal (CVBS/SIF) outputted from the tuner 110 may be inputted directly into the controller 180.

Also, the tuner 110 may receive a signal carrier RF broadcast signal according to an advanced television systems committee (ATSC) standard or a multi-carrier RF broadcast signal according to a digital video broadcasting (DVB) standard.

Meanwhile, the tuner 110 may sequentially select RF broadcast signals of all the broadcast channels stored through a channel memory function, of RF broadcast signals received via an antenna, and convert those RF broadcast signals into a medium frequency signal or a baseband video or audio signal.

The decoder 111 may execute a decoding operation by receiving a digital IF signal (DIF) converted in the tuner 110.

For example, when the digital IF signal outputted from the tuner 110 is a signal according to the ATSC standard, the decoder 111 may perform 8-vestigal side band (8-VSB) demodulation. Here, the decoder 111 may also perform trellis decoding, de-interleaving, reed Solomon decoding and the like. To this end, the decoder 111 may include a trellis decoder, de-interleaver, a reed Solomon decoder and the like.

As another example, when the digital IF signal (DIF) outputted from the tuner 110 is a signal according to the DVB standard, the decoder 111 may perform a coded orthogonal frequency division modulation (COFDMA) demodulation. Here, the decoder 111 may also perform convolution decoding, de-interleaving, reed Solomon decoding and the like. To this end, the decoder 111 may include a convolution decoder, a de-interleaver, a reed Solomon decoder and the like.

The decoder 111 may output a stream signal after decoding and channel decoding. Here, the stream signal may be a signal in which a video signal, an audio signal and a data signal are multiplexed. As one example, the stream signal may be an MPEG-2 transport stream (TS) signal obtained by multiplexing an MPEG-2 video signal and a Dolby AC-3 audio signal. In detail, an MPEG-2 TS signal may include a 4-byte header and a 184-byte payload.

The decoder 111 may be provided separately according to the ATSC standard and the DVB standard. That is, an ATSC decoder and a DVB decoder may be provided.

The stream signal output from the decoder 111 may be inputted into the controller 180. The controller 180 may perform demultiplexing, video/audio signal processing and the like, output video on the flexible display unit 140 and output audio to the audio output unit 124.

The external device interface 122 may connect an external device and the image display device 100 to each other. To this end, the external device interface 122 may include an A/V input/output unit (not shown) or a wireless communication unit (not shown).

The external device interface 122 may be connected, in a wired or wireless manner, to an external device, such as a digital versatile disk (DVD), a Blu-ray, a game machine, a camera, a camcorder, a laptop computer (notebook) and the like. The external device interface 122 may transfer a video, audio or data signal input from the exterior via the connected external device to the controller 180 of the image display device 100, and also output a video, audio or data signal processed in the controller 180 to the external device. For this, the external device interface 122 may include the A/V input/output unit or the wireless communication unit.

The A/V input/output unit may include a universal serial bus (USB) terminal, a composite video banking sync (CVBS) terminal, a component terminal, a S-video terminal (analog), a digital visual interface (DVI) terminal, a high definition multimedia interface (HDMI) terminal, an RGB terminal, a D-SUB terminal, and the like to allow video and audio signals of the external device to be inputted into the image display device 100.

The wireless communication unit may execute short-range wireless communication with other electronic devices. The image display device 100 may be connected to the other electronic device via a network according to communication standards, such as Bluetooth, radio frequency identification (RFID), infrared data association (IrDA), ultra wideband (UWB), Zigbee and the like.

The external device interface 122 may also be connected via at least one of various set-top boxes and the aforementioned various terminals, to execute input/output operations with the set-top boxes.

The external device interface 122 may execute data transmission and reception with the 3D viewer 140a.

The network interface 123 may provide an interface for connecting the image display device 100 to a wired or wireless network which includes an Internet network. The network interface 123 may include an Ethernet terminal for connection to the wired network, and use communication standards, such as wireless LAN (WLAN) (Wi-Fi), wireless broadband (Wibro), world interoperability for microwave access (Wimax), high speed downlink packet access (HSDPA) and the like for connection to the wireless network.

The network interface 123 may receive contents or data provided by a contents provider or a network operator via a network. That is, the network interface 123 may receive contents, such as a movie, an advertisement, a game, a video on demand (VOD), a broadcast signal provided by the network operator, and related information via a network. The network interface 123 may also receive update information related to firmware and update files provided by the network operator.

Also, the network interface 123 may transmit data to the contents provider or the network operator.

The network interface 123 may be connected to, for example, an Internet protocol (IP) TV, so as to receive a video, audio or data signal processed in an IPTV set-top box and transfer it to the controller 180 for allowing bi-directional communication. The network interface 123 may also transfer signals processed in the controller 180 to the IPTV set-top box.

The IPTV may indicate ADSL-TV, VDSL-TV, FTTH-TV or the like or indicate TV over DSL, Video over DSL, TV overIP (TVIP), Broadband TV (BTV) or the like, according to a type of transmission network. Also, the IPTV may indicate an Internet-accessible Internet TV, and a full-browsing TV.

The storage unit 130 may store programs for signal processing and control by the controller 180, and also store processed video, audio or data signals.

The storage unit 130 may execute a function of temporarily storing a video, audio or data signal input via the external device interface 122. Also, the storage unit 130 may store information related to a predetermined broadcast channel through a channel memory function of a channel map and the like.

The storage unit 130 may include at least one storage medium of a flash memory-type storage medium, a hard disc-type storage medium, a multimedia card micro-type storage medium, a card-type memory (for example, SD or XD memory), a random access memory (RAM), a read-only memory (ROM) (e.g., electrically erasable programmable ROM (EEPROM)), and the like. The image display device 100 may reproduce a file (a video file, a still image file, a music file, a document file, etc.) stored in the storage unit 130 to provide to a user.

FIG. 1 illustrates an exemplary embodiment having the storage unit 130, separated from the controller 180. In an alternative embodiment, the storage unit 130 may alternatively be configured to be included in the controller 180.

The user input interface 121 may transfer a user-input signal to the controller 180, or a signal from the controller 180 to the user.

For example, the user input interface 121 may receive a user input signal, such as a power on/off, a channel selection, a screen setting and the like from the remote controller 121a, or transmit a signal from the controller 180 to the remote controller 121a, according to various communication standards, such as RF communication, IR communication and the like.

The user input interface 121, for example, may also transfer a user input signal, which is inputted from a local key (not shown), such as a power key, a channel key, a volume key, or a setting key, to the controller 180, for example.

Also, for example, the user input interface 121 may transfer a user input signal, which is inputted from a sensing unit (not shown) for sensing a user's gesture, to the controller 180 or transmit a signal from the controller 180 to the sensing unit (not shown). Here, the sensing unit may include a touch sensor, a voice sensor, a position sensor, a motion sensor and the like.

The controller 180 may demultiplex stream, which is inputted via the tuner 110, the decoder 111 or the external device interface 122 or process the demultiplexed signals, to generate and output signals for outputting video or audio.

The video signal processed in the controller 180 may be inputted to the flexible display unit 140 to be outputted as an image corresponding to the image signal. Also, the video signal processed in the controller 180 may be inputted to an external output device through the external device interface 122.

The audio signal processed in the controller 180 may be outputted to the audio output unit 124. The audio signal processed in the controller 180 may be inputted to an external output device through the external device interface 122. Although not shown in FIG. 1, the controller 180 may include a demultiplexer, an image processor and the like.

Besides, the controller 180 may control an overall operation of the image display device 100. For example, the controller 180 may control the tuner 110 to select an RF broadcast corresponding to a user-selected channel or a pre-stored channel.

The controller 180 may also control the image display device 100 by a user command inputted via the user input interface 121 or an internal program.

For example, the controller 180 may control the tuner 110 to input a signal of a channel, which is selected in response to a predetermined channel select command received via the user input interface 121. The controller 180 may then process a video, audio or data signal of the selected channel. The controller 180 may control information related to the user-selected channel to be outputted through the flexible display unit 140 or the audio output unit 124 together with the processed video or audio signal.

As another example, the controller 180 may control a video signal or an audio signal, which is inputted from an external device, for example, a camera or a camcorder through the external device interface 122 in response to an external device image reproduce command received through the user input interface 121, to be outputted through the flexible display unit 140 or the audio output unit 124.

In the meantime, the controller 180 may control the flexible display unit 140 to display an image. For example, the controller 180 may control the flexible display unit 140 to output a broadcast image inputted through the tuner 110, an externally input image inputted through the external device interface 122, an image inputted through the network interface 123, or an image stored in the storage unit 130.

Here, the image output on the flexible display unit 140 may be a still image or a video, and a 2D or 3D image.

The controller 180 may allow a predetermined object within the image displayed on the flexible display unit 140 to be generated and displayed as a 3D object. For example, the object may be at least one of an accessed web screen (a newspaper, a journal, etc.), an electronic program guide (EPG), various menus, a widget, an icon, a still image, a video, and text.

The 3D object may be processed to have a different depth from the image displayed on the flexible display unit 140. Preferably, the 3D object may be processed to appear to protrude more than the image displayed on the flexible display unit 140.

In the meantime, the controller 180 may recognize a user's location based on an image captured by a capturing element (not shown). For example, the controller 180 may recognize a distance (z-axial coordinates) between the user and the image display device 100. Also, the controller 180 may recognize x-axial coordinates and y-axial coordinates within the image display device 100 corresponding to the user's location.

Although not shown, the image display device 100 may further include a channel browsing processor, which generates a thumbnail image corresponding to a channel signal or an externally input signal. The channel browsing processor may receive a stream signal outputted from the decoder 111 or a stream signal outputted from the external device interface 122, extract an image from the input stream signal, and generate a thumbnail image. The generated thumbnail image may be inputted to the controller 180 as it is or after being encoded. Also, the generated thumbnail image may be inputted to the controller 180 after being encoded into a stream format. The controller 180 may output on the flexible display unit 140 a thumbnail list including a plurality of thumbnail images using the input thumbnail image. The thumbnail list may be displayed in a briefly viewing manner in which the list is displayed on a partial region while displaying a predetermined image on the flexible display unit 140, or in a fully viewing manner in which the list is displayed on most regions of the flexible display unit 140.

The flexible display unit 140 may generate a driving signal by converting an image signal, a data signal, an OSD signal and a control signal processed in the controller 180, or an image signal, a data signal and a control signal received via the external device interface 122.

The present embodiment of the invention illustrates that the flexible display unit 140 is transformable (variable) into a flat form or a curved form. When the flexible display unit 140 is transformed into the curved form surrounding a user located in front thereof, the flexible display unit 140 may provide the user with intense quality of image and allow the user to feel more involved in an image displayed thereon. The flexible display unit 140 may be implemented by an organic light emitting diode (OLED) panel or a flexible liquid crystal display (LCD) panel, for example.

The flexible display unit 140 may be configured to provide a 3D image to a user. To view the 3D image, the flexible display unit 140 may be classified into an additional displaying method and an independent displaying method.

The independent displaying method may be configured such that a 3D image can be implemented only by the flexible display unit 140 without a separate 3D viewer 140a, for example, 3D glasses or the like. Various technologies such as a lenticular technology, a parallax barrier technology and the like may be applied as the independent displaying method.

The additional displaying method may be configured to implement a 3D image by using the 3D viewer 140a in addition to the flexible display unit 140. As one example, various methods such as a head mount display (HMD) type, a glass type and the like may be applied. Also, the glass type may be divided into a passive glass type such as a polarized glass type and the like, and an active glass type such as a shutter glass type and the like. The HMD type may also be divided into a passive HMD type and an active HMD type.

The flexible display unit 140 may be implemented as a touch screen so as to be used as an input device as well as an output device.

The driving unit 150 may transform the flexible display unit 140 into a flat form or a curved form. The driving unit 150 may transmit an electric signal to the flexible display unit 140 such that the flexible display unit 140 can be transformed by itself, or apply a physical force to the flexible display unit 140 directly or indirectly to transform the flexible display unit 140.

The audio output unit 124 may output sound by receiving an audio signal processed in the controller 180, for example, a stereo signal, a 3.1 channel signal or a 5.1 channel signal. The audio output unit 124 may be implemented by various types of speakers.

Meanwhile, to sense a user's gesture, as aforementioned, the image display device 100 may further include a sensing unit (not shown) having at least one of a touch sensor, a voice sensor, a location sensor, and a motion sensor. A signal sensed by the sensing unit may be transferred to the controller 180 via the user input interface 121.

The controller 180 may sense a user's gesture based on an image captured by the capturing element (not shown), a signal sensed by the sensing unit (not shown) or a combination thereof.

The power supply unit 190 may supply power to every component of the image display device 100. Especially, the power supply unit 190 may supply power to the controller 180 which may be implemented in a form of a system on chip (SOC), the flexible display unit 140 to display an image, and the audio output unit 124 to output an audio. Also, depending on embodiments, power may be supplied to a heat generator including a hot wire.

The remote controller 121a may transmit a user input to the user input interface 121. To this end, the remote controller 121a may use various communication standards, such as IR communication, RF communication, Bluetooth, ultra wideband (UWB), Zigbee and the like. Also, the remote controller 121a may receive a video, audio or data signal output from the user input interface 121, so as to display the signal on the remote controller 121a or output the signal on the remote controller 121a in form of sound.

The image display device 100 may include a fixed digital broadcast receiver capable of receiving at least one of ATSC (8-VSB) broadcast programs, DVB-T (COFDM) broadcast programs, and ISDB-T (BST-OFDM) broadcast programs or a mobile digital broadcast receiver capable of receiving at least one of terrestrial DMB broadcast programs, satellite DMB broadcast programs, ATSC-M/H broadcast programs, DVB-H (COFDM) broadcast programs, and Media Forward Link Only (MediaFLO) broadcast programs. Alternatively, the image display device 100 may include an IPTV digital broadcast receiver capable of receiving cable broadcast programs, satellite broadcast programs or IPTV programs.

The image display device disclosed herein may include a TV receiver, a cellular phone, a smart phone, a notebook computer, a digital broadcasting terminal, a personal digital assistant (PDA), a portable multimedia player (PMP) and the like.

The block diagram of the image display device illustrated in FIG. 1 is a block diagram of one exemplary embodiment. Each component of the block diagram may be combined, added or omitted according to the configuration of the image display device 100. That is, if necessary, two or more components may be combined into one component, or one component may be divided into two components. Also, a function performed in each block is merely illustrative, and a detailed operation or device should not limit the scope of the claims.

Figure 2:
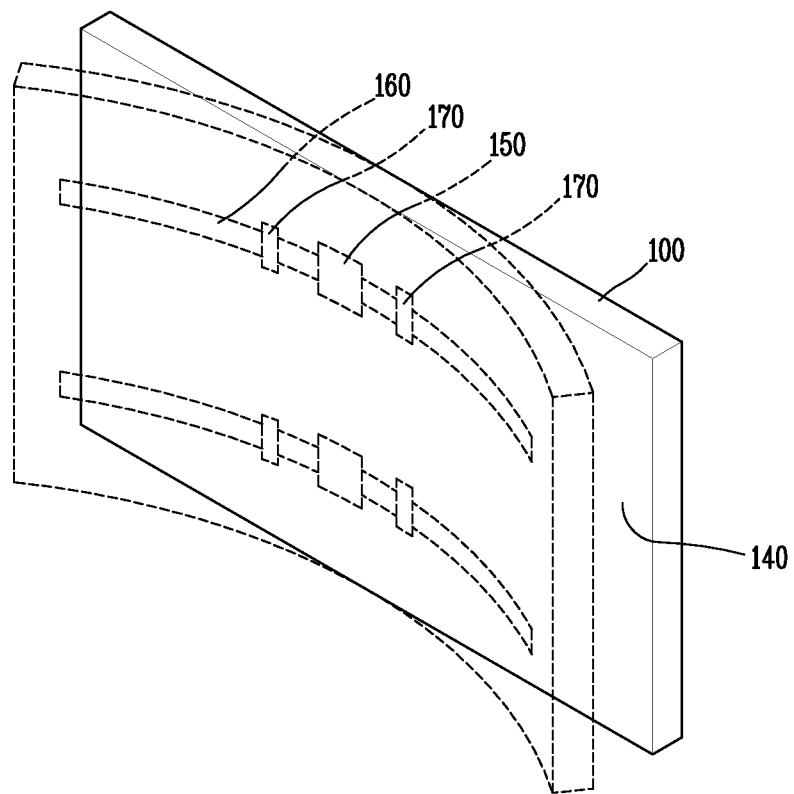
FIG. 2 is a conceptual view of an image display device according to an embodiment of the present invention.
Figure 3:
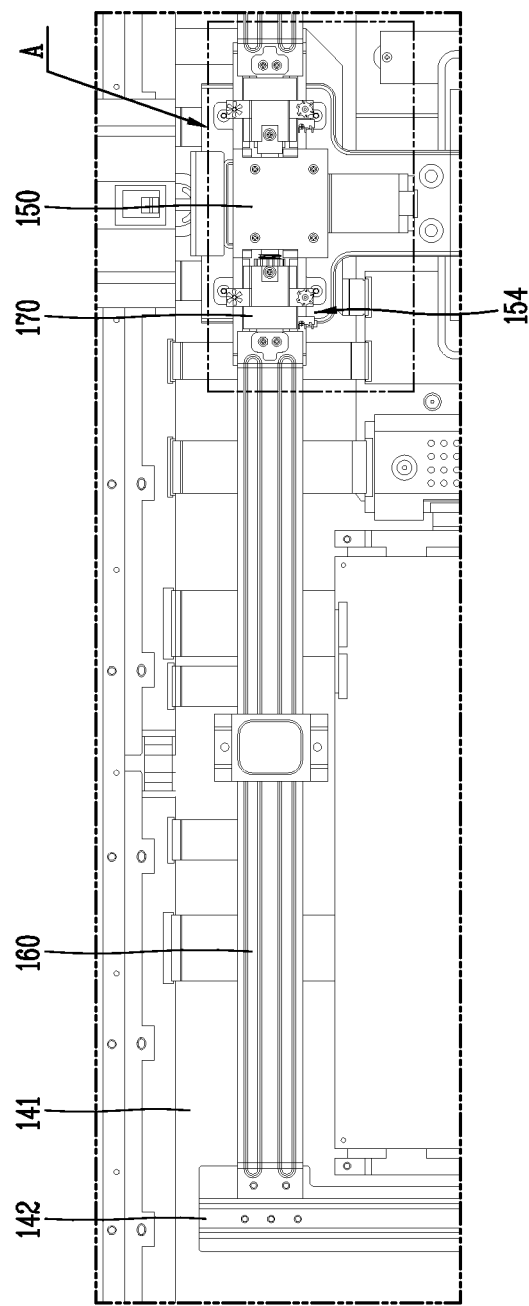
FIG. 3 is a conceptual view illustrating a structure of a variable mechanism of a flexible display unit of FIG. 2.

FIG. 2 is a conceptual view of an image display device 100 according to an embodiment of the present invention, and FIG. 3 is a conceptual view illustrating a structure of a variable mechanism of a flexible display unit of FIG. 2.

Referring to FIGS. 2 and 3, the image display device 100 includes a flexible display unit 140, a pressing member 160, a driving unit 150 and an adjusting unit 170.

The flexible display unit 140 is configured to be curved by an external force, between a first state and a second state having different curved degrees. For instance, the first state may be a flat state of the display unit 140, and the second state may be a curved state of the display unit 140. The flexible display unit 140 may have different curvature radiuses between the first state and the second state.

If the flexible display unit 140 is curved, by an external force, so as to enclose a user (viewer) who is at front thereof, a picture quality and concentration feeling may be provided to the user with the sense of reality. The flexible display unit 140, which has been curved, may be restored to the flat state by an external force.

The flexible display unit 140 includes a panel (not shown), and a supporting member 141 for supporting the panel. The panel is configured as a bendable panel (e.g., OLED panel). The supporting member 141 is configured to be transformable together with the panel by covering a rear surface of the panel. Preferably, the supporting member 141 is formed of an elastically-transformable material (e.g., stainless steel, titanium, carbon fiber, etc.).

The pressing member 160 is mounted to a rear surface of the flexible display unit 140, and is configured to apply an external force to the flexible display unit 140 by curving. As shown in FIG. 2, the pressing member 160 may be a bar-type plate extending to the right and left sides of the flexible display unit 140, with respect to the driving unit 150.

One end of the pressing member 160 is coupled to a left end or a right end of the flexible display unit 140, and another end of the pressing member 160 is coupled to the adjusting unit 170 connected to the driving unit 150. Even when the flexible display unit 140 is in a flat state, the pressing member 160 may be in a curved state to some degree, toward a front surface of the flexible display unit 140, because the adjusting unit 170 protrudes from the rear surface of the flexible display unit 140.

For stable driving, the pressing member 160 is provided in plurality in number. For instance, the plurality of pressing members 160 may be arranged at an upper side and a lower side of the flexible display unit 140. Side bars 142, configured to prevent distortion of the flexible display unit 140 by being extended in a vertical direction, may be coupled to a right end and a left end of the supporting member 141. As shown in FIG. 3, the side bars 142 may be coupled to the pressing members 160 disposed at the upper side and the lower side of the flexible display unit 140, respectively.

The driving unit 150 is configured to push or pull on the pressing member 160, so as to curve or restore the pressing member 160. As the pressing member 160 is pushed to be curved, or as the pressing member 160 is pulled to be restored, the flexible display unit 140 is transformable between the first state and the second state.

More specifically, if the driving unit 150 pushes on the pressing member 160, the pressing member 160 is more curved than before. Accordingly, the pressing member 160 presses against the left side or the right side of the flexible display unit 140. As a result, the flexible display unit 140, which is in a flat state, may transform to a curved state.

On the contrary, if the driving unit 150 pulls on the pressing member 160, the pressing member 160 becomes more flat than before (i.e., the pressing member 160 is more restored to the flat state). In this case, the flexible display unit 140, which has been curved, is pulled to be restored to the flat state, as the pressing member 160 coupled thereto is restored.

The adjusting unit 170 is configured to connect the pressing member 160 and the driving unit 150 to each other. The adjusting unit 170 is movable so as to be far from or close to the driving unit 150 so that a curved degree of the pressing member 160 can be adjusted. If the adjusting unit 170 becomes far from the driving unit 150, the pressing member 160 connected to the adjusting unit 170 is pushed to the side direction. As a result, the pressing member 160 is more curved than before. On the contrary, if the adjusting unit 170 becomes close to the driving unit 150, the pressing member 160 connected to the adjusting unit 170 is pulled to be restored.

The adjusting unit 170 may be moved by operation of the driving unit 150, or by its rotary manipulation, to be described below. If the adjusting unit 170 is moved by operation of the driving unit 150, the flexible display unit 140 is driven in variously curved. On the contrary, if the adjusting unit 170 is moved by its rotary manipulation, a curved degree of the flexible display unit 140 is micro-compensated.

Hereinafter, the image display device 100, capable of implementing a variable curving of the flexible display unit 140, and capable of compensating for a curved degree of the flexible display unit 140 at micro levels will be explained in more detail.

Firstly, a method for micro-compensating for a curved degree of the flexible display unit 140 will be explained. As aforementioned in the background of the disclosure, an initial curvature of the flexible display unit 140 of the image display device 100 may be out of a preset range, due to component tolerances and an assembly tolerance. Such problem may occur while the image display device 100 is used.

Figure 4:
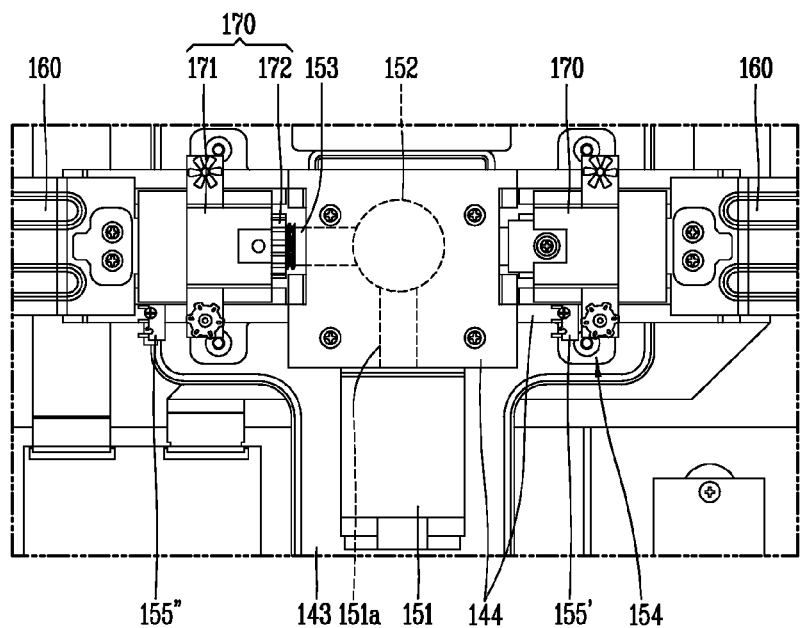
FIG. 4 is an enlarged view of part 'A' in FIG. 3.
Figure 5:
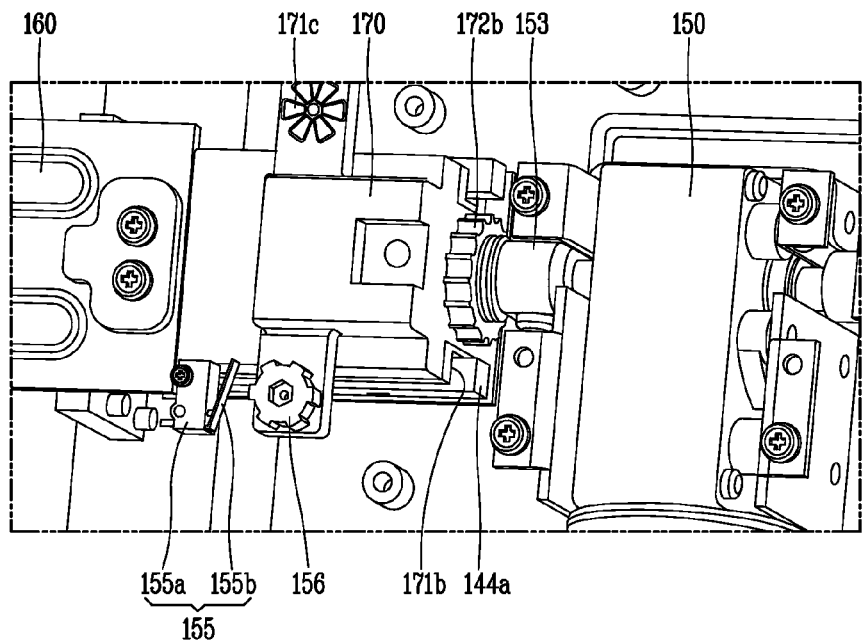
FIG. 5 is a conceptual view for explaining a mechanism for micro-compensating for a gap between a driving unit and an adjusting unit by a rotational operation of a screw nut of FIG. 4.
Figure 6:
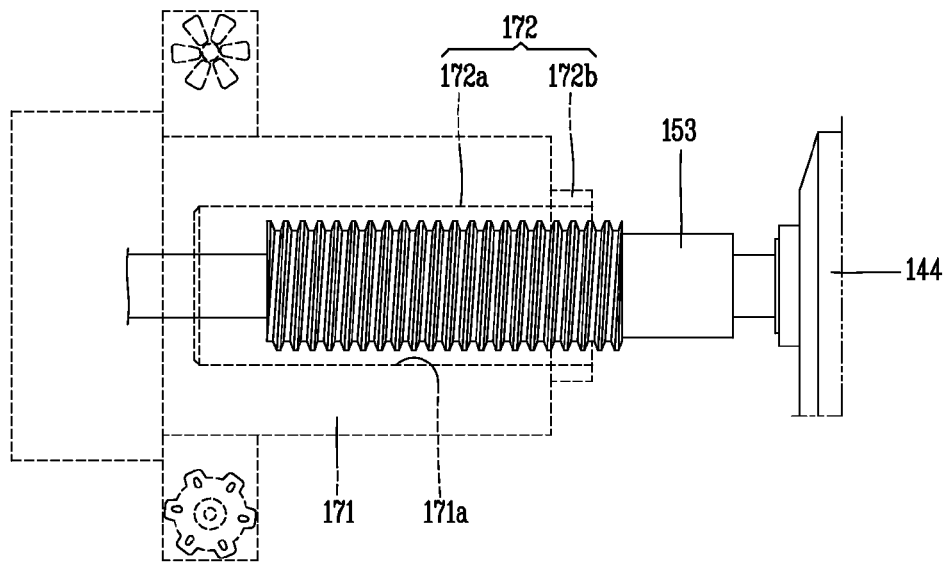
FIG. 6 is a conceptual view illustrating a coupling structure between a lead screw and a screw nut of FIG. 4.

FIG. 4 is an enlarged view of part 'A' in FIG. 3, and FIG. 5 is a conceptual view for explaining a mechanism for micro-compensating for a gap between the driving unit 150 and the adjusting unit 170 by a rotational operation of a screw nut 172 of FIG. 4. In FIG. 5, part of a frame 144 has been excluded for convenience. FIG. 6 is a conceptual view illustrating a coupling structure between a lead screw 153 and a screw nut 172 of FIG. 4.

Referring to FIGS. 4 to 6, the driving unit 150 is disposed at a central part of the flexible display unit 140, so that a uniform force is applied to the left pressing member 160 and the right pressing member 160, and thus the curved pressing members 160 can uniformly press on two sides of the flexible display unit 140. For stable driving, the driving unit 150 may be arranged at an upper side and a lower side of the flexible display unit 140. However, the present invention is not limited to this. For example, one driving unit 150 may be disposed at a central part of the flexible display unit 140. In this case, side bars 142 may be installed at two sides of the flexible display unit 140, so as to prevent distortion of the flexible display unit 140 occurring from the upper side and the lower side.

FIGS. 4 and 5 illustrate that the driving unit 150 is installed at the frame 144, and the frame 144 is mounted to a bracket 143 installed on a rear surface of the supporting member 141. The driving unit 150 may include a driving motor 151, a bevel gear 152 and a lead screw 153.

The driving motor 151 is configured to generate a rotational force to a driving shaft 151a, and the driving shaft 151a is rotatable clockwise or counterclockwise according to a driving signal applied from the controller 180. Under such configuration, the lead screw 153 is indirectly connected to the driving shaft 151a is also rotatable clockwise or counterclockwise.

The bevel gear 152 changes a direction of the rotational force generated from the driving shaft 151a. A deceleration gear may be disposed between the driving shaft 151a and the bevel gear 152. The deceleration gear may decrease a rotational speed of the driving shaft 151a, or may increase a rotational speed of the driving shaft 151a.

The lead screw 153 is directly or indirectly connected to the bevel gear 152, thereby being rotated by operation of the driving motor 151. The lead screw 153 is provided in a direction perpendicular to the driving shaft 151a. The lead screws 153 are rotatable by being provided at two sides of the bevel gear 152.

The lead screw 153 may be screw-coupled to the adjusting unit 170 so that the lead screw 153 and the adjusting unit 170 can perform a relative motion with respect to each other. The relative motion may be performed by rotation of the lead screw 153 or the adjusting unit 170. By such relative motion, the pressing member 160 may be movable close to or far from the driving unit 150. As a result, a curved degree of the flexible display unit 140 may be changed.

The adjusting unit 170 includes a body 171 and a screw nut 172.

The body 171 is coupled to the pressing member 160, and is provided with an accommodation portion 171a formed to be open on one side surface thereof facing the lead screw 153. The body 171 is configured to be slidable on a rear surface of the flexible display unit 140. Such slidable structure will be explained later.

An insertion portion 172a of the screw nut 172 is inserted into the accommodation portion 171a, and is screw-coupled to the lead screw 153 so as to perform a relative motion with respect to the lead screw 153. The screw nut 172 is provided with a manipulation portion 172b formed to be rotatable, the manipulation portion 172b configured to support one side surface of the screw nut 172 facing the lead screw 153. The manipulation portion 172b may be provided with a plurality of teeth of the same shape, the teeth protruding from an outer circumference of the manipulation portion 172b at preset intervals.

The screw nut 172 may perform a relative motion with respect to the lead screw 153, by a rotational operation of the manipulation portion 172b. By the relative motion, the pressing member 160 is more curved than before, or is more restored to the flat state than before. A curved degree of the flexible display unit 140 may be changed according to a curved degree of the pressing member 160.

More specifically, if the screw nut 172 is moved further from an exposed end of the lead screw 153 as the manipulation portion 172b is rotated in one direction, the body 171 of which one surface is supported by the screw nut 172 is also moved to the same direction. In this case, the pressing member 160 coupled to the body 171 is moved backward to be more curved than before. On the contrary, if the screw nut 172 is moved to be closer to the exposed end of the lead screw 153 as the manipulation portion 172b is rotated in another direction, the body 171 is also moved to the same direction by the pressing member 160. As a result, the pressing member 160 is more restored to the flat state than before.

The relative motion between the screw nut 172 and the lead screw 153 by a rotational operation of the manipulation portion 172b is used to micro-compensate for a curved degree of the flexible display unit 140.

When one teeth is moved to its neighboring teeth based on a screw thread pitch of the lead screw 153, a rotation angle of the screw nut 172, etc., a relative movement distance between the screw nut 172 and the lead screw 153 can be acquired. If the manipulation portion 172b is rotated based on the acquired information, a curved degree of the flexible display unit 140 can be adjusted in a more micro manner.

The body 171 is formed to be slidable on a rear surface of the flexible display unit 140, by a relative motion between the lead screw 153 and the screw nut 172. A guide rail 144a, configured to guide a sliding motion of the body 171 by being inserted into a guide recess 171b of the body 171, may be provided at the frame 144 where the driving unit 150 is mounted. The guide rail may be integrally formed at the frame 144. Alternatively, the guide rail may be formed as an additional member, and may be coupled to the frame 144.

Under such configuration, the driving unit 150 and the adjusting unit 170 are installed at the frame 144, and the pressing member 160 is mounted to the adjusting unit 170. That is, such components may be configured as a single module for implementing a curved state of the flexible display unit 140. Accordingly, an assembly characteristic can be enhanced.

As aforementioned, a curved degree of the flexible display unit 140 can be micro-compensated. Upon completion of such micro-compensation, the flexible display unit 140 may be variable between a first state and a second state by operation of the driving unit 150. This will be explained in more detail.

Figure 7:
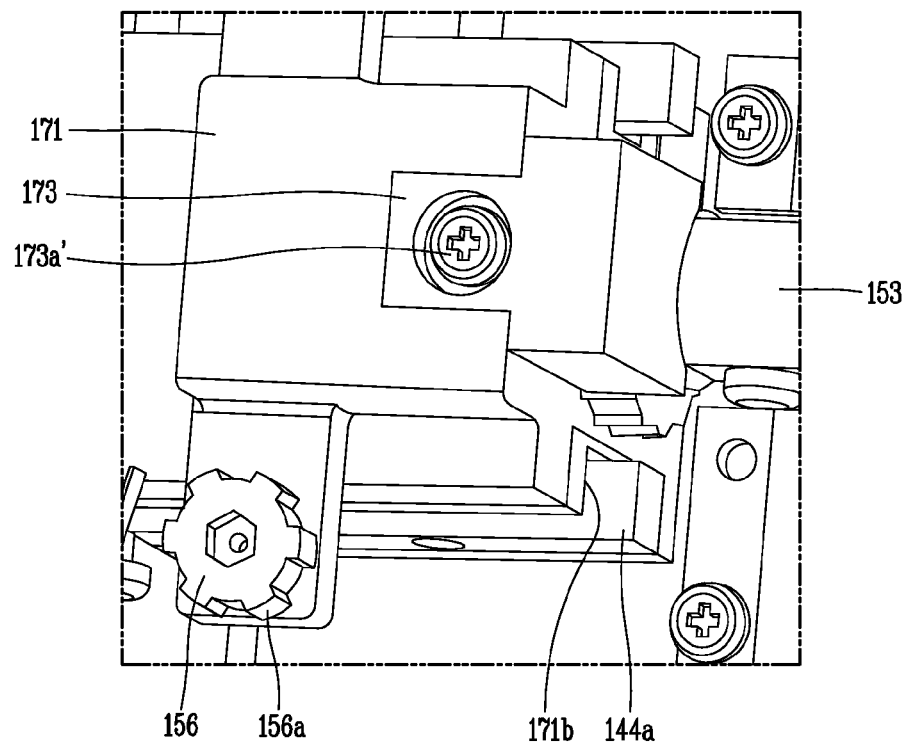
FIG. 7 is a conceptual view illustrating a coupled state of a fixing member, after a gap between the driving unit and the adjusting unit of FIG. 6 has been micro-compensated.
Figure 8:
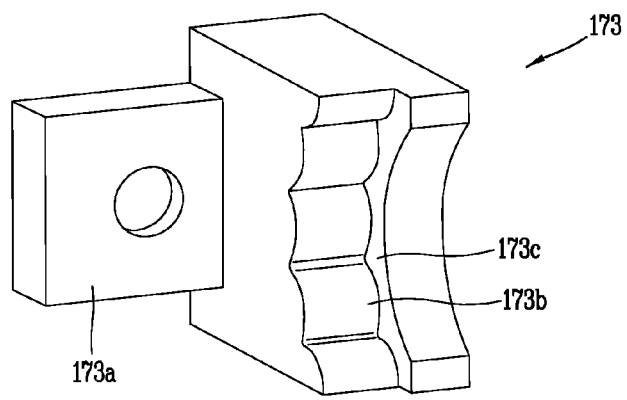
FIG. 8 is a view illustrating a bottom side of the fixing member of FIG. 7.

FIG. 7 is a conceptual view illustrating a coupled state of a fixing member 173, after a gap between the driving unit 150 and the adjusting unit 170 of FIG. 6 has been micro-compensated. FIG. 8 is a view illustrating a bottom side of the fixing member 173 of FIG. 7. Referring to FIG. 4, the fixing member 173 has not been coupled to the adjusting unit 170 on the left side of the driving unit 150, whereas the fixing member 173 has been coupled to the adjusting unit 170 on the right side of the driving unit 150.

Referring to FIGS. 7 and 8, the adjusting unit 170 further includes a fixing member 173 detachably-coupled to the body 171, and configured to fix the screw nut 172 when coupled to the body 171.

That is, the fixing member 173 is separated from the body 171 when micro-compensating for a curved degree of the flexible display unit 140. Upon completion of the micro-compensation, the fixing member 173 is coupled to the body 171 to thus fix the screw nut 172. For this, the fixing member 173 includes a coupling portion 173*a*, an engaging portion 173*b* and a cover portion 173*c*.

The coupling portion 173*a* serves to detachably-couple the fixing member 173 to the body 171. In the drawings, the coupling portion 173*a* is disposed to cover an upper surface of the body 171, and a coupling member 173*a*' couples the coupling portion 173*a* to the body 171 by passing through a coupling hole.

The engaging portion 173*b* is engaged to at least part of the manipulation portion 172*b*, so that the screw nut 172 can be prevented from being rotated when the coupling portion 173*a* is coupled to the body 171. For instance, as shown in FIG. 8, the engaging portion 173*b* is formed in the fixing member 173, and has a concavo-convex shape so as to be engaged with an upper teeth of the manipulation portion 172*b*.

The cover portion 173*c* is configured to cover one side of the manipulation portion 172*b* when the coupling portion 173*a* is coupled to the body 171, so that the screw nut 172 can be prevented from being separated from the accommodation portion 171*a*.

Under such configuration, if the fixing member 173 is coupled to the body 171 upon completion of the micro-compensation, the screw nut 172 is fixed to the body 171 by the cover portion 173*c*, while it is prevented from being rotated by the engaging portion 173*b*.

If the lead screw 153 is rotated by operation of the driving motor 151 in a state where the screw nut 172 has been fixed to the body 171, the screw nut 172 and the body 171 coupled to the screw nut 172 perform a relative motion with respect to each other, in a direction to become closer to or further from the lead screw 153. As a result, the pressing member 160 is also moved in the same direction as the body 171. Accordingly, the flexible display unit 140 is variable between the first state and the second state.

In the embodiment of the present invention, a variable driving of the flexible display unit 140 can be implemented by using a relative motion between the lead screw 153 and the screw nut 172. A curved degree of the flexible display unit 140 can be micro-adjusted by a rotational operation of the screw nut 172. For instance, an initial curvature of the flexible display unit 140 may be compensated under such structure.

There is a limitation in compensating for a curvature range of the flexible display unit 140, only by the driving unit 150 which generates a driving force for varying the flexible display unit 140. Hereinafter, a structure for micro-compensating for a curvature range of the flexible display unit 140 will be explained.

Figure 9:
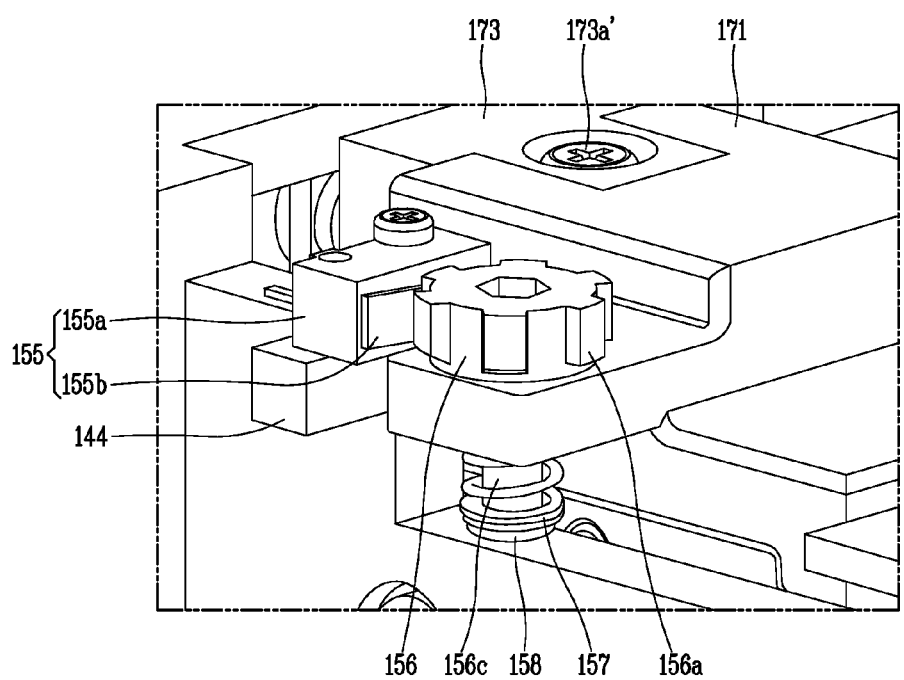
FIG. 9 is a conceptual view for explaining a mechanism that one of a plurality of protrusions is selected while a clicker of FIG. 4 is rotated.

FIG. 9 is a conceptual view for explaining a mechanism that one of a plurality of protruded portions 156*a* is selected while a clicker 156 is rotated.

Referring to FIG. 9 with FIG. 4, the image display device 100 is provided with an operation restricting unit 154. The operation restricting unit 154 is configured to generate a signal for restricting an operation of the driving unit 150 when the adjusting unit 170 has moved more than a preset range by operation of the driving unit 150. The operation restricting unit 154 may control an operation of the driving unit 150, based on a moving range of the adjusting unit 170 related to a curved degree of the pressing member 160.

A structure and a mechanism of the operation restricting unit 154 will be explained in more detail.

The operation restricting unit 154 includes a limit switch 155 and a clicker 156.

The limit switch 155 may be installed on a rear surface of the flexible display unit 140, and the clicker 156 may be mounted to the adjusting unit 170. In the drawings, the limit switch 155 is installed at the frame 144, and the clicker 156 is installed at the body 171. Under such configuration, as the body 171 is moved, the limit switch 155 and the clicker 156 become closer to or further from each other. Alternatively, the limit switch 155 may be installed at the body 171, and the clicker 156 may be installed at the frame 144.

The clicker 156 is configured to press the limit switch 155 when the adjusting unit 170 has moved more than a preset range. The pressed limit switch 155 generates a signal, and the controller 180 stops the driving unit 150 based on the signal.

In the drawings, the limit switch 155 includes a switch body 155*a* and an extended portion 155*b* extended from the switch body 155*a* in the form of a cantilever. The extended portion 155*b* is configured to generate the signal for restricting an operation of the driving unit 150 when switching the switch body 155*a* by pressure of the clicker 156.

The limit switch 155 is not necessarily limited to have the structure of a cantilever. That is, the limit switch 155 may have other structure for generating the signal when pressed by the clicker 156.

The limit switch 155 may be formed in plurality, and may be disposed on the right and left sides of the driving unit 150. In the drawings, a first limit switch 155' is disposed on the right side of the driving unit 150, while a second limit switch 155" is disposed on the left side of the driving unit 150 when a rear surface of the flexible display unit 140 is viewed. Alternatively, the first limit switch 155' may be disposed on the left side of the driving unit 150, while the second limit switch 155" may be disposed on the right side of the driving unit 150.

The first limit switch 155' is configured to contact the clicker 156 when the adjusting unit 170 moves close to the driving unit 150 within a preset range. That is, the first limit switch 155' serves to micro-compensate for a curved degree of the flexible display unit 140 when the flexbile display unit 140 is restored to the flat state.

On the contrary, the second limit switch 155" is configured to contact the clicker 156 when the adjusting unit 170 moves far from the driving unit 150 out of a preset range. That is, the second limit switch 155" serves to micro-compensate for a curved degree of the flexible display unit 140 when the flexbile display unit 140 is curved to the maximum.

As aforementioned, the first limit switch 155' and the second limit switch 155" may be disposed to correspond to the adjusting units 170 which are at both sides of the driving unit 150, respectively. That is, one limit switch 155 is configured to directly restrict an operation of its corresponding adjusting unit 170. In this case, an operation of another adjusting unit 170 may be also controlled (allowed or restricted) by the driving unit 150.

The embodiment of the present invention provides a structure for micro-compensating for a curved degree of the flexible display unit 140 at the first state and the second state. Hereinafter, such structure will be explained in more detail.

The clicker 156 is provided with a plurality of protruded portions 156a protruding from an outer circumference of the clicker 156 with different heights, and the clicker 156 is rotatably coupled to the body 171. That is, while the clicker 156 is rotated, one of the plurality of protruded portions 156a may be selected so as to press the extended portion 155b. Once the adjusting unit 170 has moved more than a preset range by operation of the driving unit 150, one of the plurality of protruded portions 156a presses the extended portion 155b.

As aforementioned, the plurality of protruded portions 156a protrude with different heights. This may cause gaps between the plurality of protruded portions 156a and the limit switch 155 to be different for different protruded portion. For instance, if the clicker 156 is rotated so that the protruded portion 156a having a relatively low height is disposed to face the extended portion 155b, the gap between the extended portion 155b and the protruded portion 156a becomes relatively wide. Under such configuration, the adjusting unit 170 can move more than before, and the pressing member 160 can be curved more than before.

As one of the plurality of protruded portions 156a is selected, a moving range of the adjusting unit 170 can be micro-compensated. This means that a curved degree of the flexible display unit 140 between the first state and the second state can be micro-compensated.

The clicker 156 which has been rotated may be fixed to be prevented from being arbitrarily rotated. Hereinafter, a structure for fixing the clicker 156 will be explained.

Figure 10:
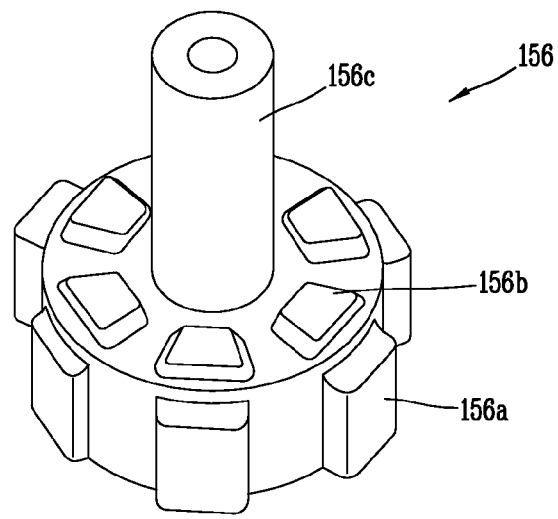
FIG. 10 is a view illustrating a bottom surface of the clicker of FIG. 9.
Figure 11:
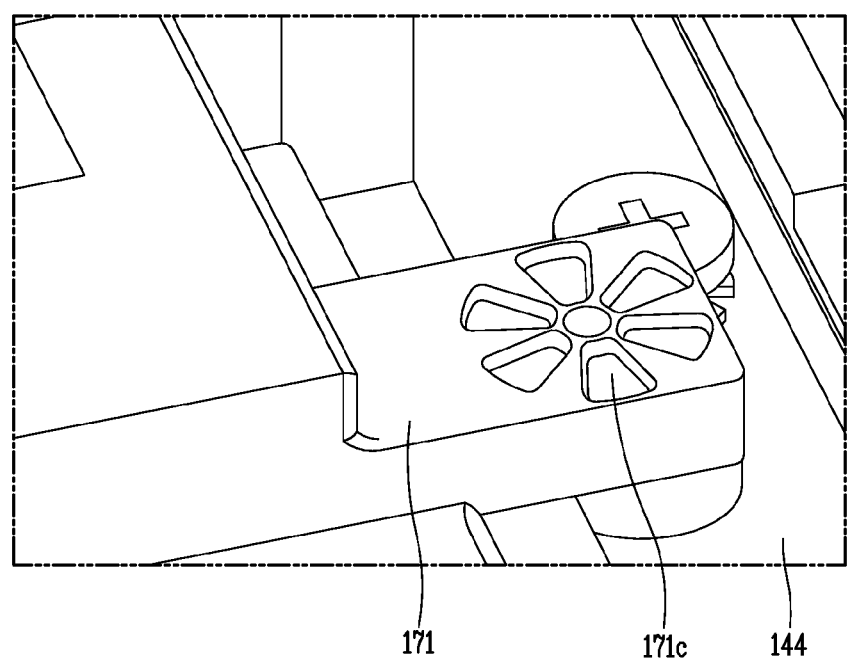
FIG. 11 is a view illustrating a fixing groove at a body for fixing the clicker of FIG. 9.

FIG. 10 is a view illustrating a bottom surface of the clicker 156 of FIG. 9, and FIG. 11 is a view illustrating a fixing groove 171c at the body 171 for fixing the clicker 156 of FIG. 9.

Referring to FIGS. 10 and 11, a plurality of fixing grooves 171c configured to fix the clicker 156 may be formed at the body 171. And a plurality of fixing protrusions 156b, configured to fix the clicker 156 by being mounted to the fixing grooves 171c, respectively, may be formed at the clicker 156. Alternatively, a plurality of fixing protrusions 156b may be formed at the body 171, and a plurality of fixing grooves 171c may be formed at the clicker 156.

The number of the fixing protrusions 156b may be equal to the number of the protruded portions 156a so that one of the plurality of protruded portions 156a for pressing the limit switch 155 can be selected while the clicker 156 is rotated. Preferably, the fixing protrusions 156b and the fixing grooves 171c are formed in shapes corresponding to each other.

Referring to FIG. 9, the operation restricting unit 154 may further include an elastic member 157 configured to press the clicker 156 toward the body 171, so that the plurality of fixing protrusions 156b having been inserted into the plurality of fixing grooves 171c, respectively, can be prevented from being separated from the fixing grooves 171c. In the draw-ings, a bar portion 156c of the clicker 156 is penetratingly-formed at the body 171, and a separation preventing member 158 is coupled to the end of the bar portion 156c. And the elastic member 157 which encircles the bar portion 156c is mounted so as to be supported by the body 171 and the separation preventing member 158, respectively.

Under such configuration, the clicker 156 may be stably fixed to the body 171. If necessary, the clicker 156 may be lifted up a little to be rotated, through a user's manipulation, so that another protruded portion 156a can be disposed to face the extended portion 155b. Then when released, the clicker 156 may be re-fixed to the body 171 by the elastic member 157.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An image display device, comprising:
    a flexible display unit transformable by a force between a first state and a second state having different curved degrees;
    a pressing member disposed at a rear surface of the flexible display unit, to apply the force to the flexible display unit;
    a driving unit to push or pull the pressing member such that a curved state of the pressing member is implemented; and
    an adjusting unit to couple the pressing member and the driving unit to each other, and movable with respect to the driving unit, the adjusting unit to adjust the curved state of the pressing member,
    wherein the driving unit includes:
    a driving motor to generate a rotational force at a driving shaft;
    a bevel gear to change a direction of the rotational force generated at the driving shaft; and
    a lead screw coupled to the bevel gear to be rotated by operation of the driving motor, and screw-coupled to the adjusting unit to move the adjusting unit close to or far from the driving unit according to a rotational direction of the lead screw.

2. The image display device of claim 1, wherein the adjusting unit includes:
    a body coupled to the pressing member and having an accommodation portion; and
    a screw nut partially or wholly inserted into the accommodation portion and screw-coupled to the lead screw to perform a relative motion with respect to the lead screw to thereby adjust for a curved degree of the flexible display unit.

3. The image display device of claim 2, wherein the screw nut is provided with a manipulation portion at one side surface of the body, the manipulation portion rotatably manipulable such that the screw nut performs the relative motion with respect to the lead screw.

4. The image display device of claim 3, wherein the manipulation portion is provided with a plurality of teeth, the teeth protruding from an outer circumference of the manipulation portion at preset intervals.

5. The image display device of claim 2, wherein the body is slidable on the rear surface of the flexible display unit by the relative motion between the lead screw and the screw nut, and
a guide rail is provided at a frame where the driving unit is disposed, the guide rail to guide a sliding motion of the body by being inserted into a guide recess of the body.

6. The image display device of claim 3, wherein the adjusting unit further includes a fixing member detachably coupled to the body, to fix the screw nut when the fixing member is coupled to the body.

7. The image display device of claim 6, wherein the fixing member includes:
a coupling portion to detachably couple the fixing member to the body;
an engaging portion to engage at least a part of the manipulation portion, such that the screw nut is prevented from being rotated when the fixing member is coupled to the body; and
a cover portion to cover at least one side of the manipulation portion when the fixing member is coupled to the body, such that the screw nut is prevented from being separated from the accommodation portion.

8. The image display device of claim 7, wherein an inner surface of the engaging portion is provided to contour an outer surface of the manipulation portion.

9. The image display device of claim 1, further comprising an operation restricting unit to restrict an operation of the driving unit when the adjusting unit has moved more than a preset range by the operation of the driving unit.

10. The image display device of claim 9, wherein the operation restricting unit includes a limit switch disposed at the rear surface of the flexible display unit; and
a clicker disposed at the adjusting unit, to press against the limit switch if the adjusting unit has moved more than a preset range such that the operation restricting unit generates a signal.

11. The image display device of claim 10, wherein the limit switch includes:
a switch body; and
an extended portion extending from the switch body, wherein the operation restricting unit generates the signal when the clicker presses against the extended portion to switch the switch body.

12. The image display device of claim 10, wherein the clicker is provided with a plurality of protruded portions protruding from an outer circumference of the clicker at different heights, and
the clicker is rotatably coupled to the adjusting unit such that one of the protruded portions presses against the limit switch, if the adjusting unit has moved more than a preset range.

13. The image display device of claim 12, wherein a plurality of fixing grooves to fix the clicker are disposed at the adjusting unit, and
a plurality of fixing protrusions to fix the clicker by being mounted to the fixing grooves, respectively, are disposed at the clicker.

14. The image display device of claim 13, wherein the number of the fixing protrusions is equal to the number of the protruded portions such that one of the plurality of protruded portions for pressing against the limit switch is selectable by rotating the clicker.

15. The image display device of claim 13, wherein the operation restricting unit further includes an elastic member to apply elastic forcebetween the clicker and the adjusting unit, such that the plurality of fixing protrusions having been inserted into the plurality of fixing grooves, respectively, are prevented from being separated from the fixing grooves.

16. The image display device of claim 10, wherein the adjusting unit is provided in plurality and the pressing member is provided in plurality, and a first pressing member and a first adjusting unit are disposed on the right side of the driving unit and a second pressing member and a second adjusting unit are disposed on the left side of the driving unit; and
the limit switch is provided in plurality, and a first limit switch is installed to correspond with one of the first and second adjusting units, and the second limit switch is installed to correspond with another of the first and second adjusting units.

17. The image display device of claim 16, wherein the first limit switch is disposed to contact a clicker corresponding to one of the first and second adjusting units when the one of the first and second adjusting units moves close to the driving unit within a first preset range.

18. The image display device of claim 17, wherein the second limit switch is disposed to contact a clicker corresponding to another one of the first and second adjusting units when the another one of the first and second adjusting units moves far from the driving unit out of a second preset range.

19. An image display device, comprising:
a flexible display unit transformable by a force between a first state and a second state having different curved degrees;
a pressing member disposed at a rear surface of the flexible display unit, to apply the force to the flexible display unit;
a driving unit to push or pull the pressing member such that a curved state of the pressing member is implemented;
an adjusting unit to couple the pressing member and the driving unit to each other, and movable with respect to the driving unit, the adjusting unit to adjust the curved state of the pressing member; and
an operation restricting unit to restrict an operation of the driving unit when the adjusting unit has moved more than a preset range by the operation of the driving unit,
wherein the operation restricting unit includes:
a limit switch disposed at the rear surface of the flexible display unit; and
a clicker disposed at the adjusting unit, to press against the limit switch if the adjusting unit has moved more than a preset range such that the operation restricting unit generates a signal.

20. The image display device of claim 19, wherein the limit switch includes:
a switch body; and
an extended portion extending from the switch body, wherein the operation restricting unit generates the signal when the clicker presses against the extended portion to switch the switch body.

21. The image display device of claim 19, wherein the clicker is provided with a plurality of protruded portions protruding from an outer circumference of the clicker at different heights, and the clicker is rotatably coupled to the adjusting unit such that one of the protruded portions presses against the limit switch, if the adjusting unit has moved more than a preset range.

22. The image display device of claim 21, wherein a plurality of fixing grooves to fix the clicker are disposed at the adjusting unit, and a plurality of fixing protrusions to fix the clicker by being mounted to the fixing grooves, respectively, are disposed at the clicker.

23. The image display device of claim 22, wherein the number of the fixing protrusions is equal to the number of the protruded portions such that one of the plurality of protruded portions for pressing against the limit switch is selectable by rotating the clicker.

24. The image display device of claim 22, wherein the operation restricting unit further includes an elastic member to apply elastic force between the clicker and the adjusting unit, such that the plurality of fixing protrusions having been inserted into the plurality of fixing grooves, respectively, are prevented from being separated from the fixing grooves.

25. The image display device of claim 19, wherein the adjusting unit is provided in plurality and the pressing member is provided in plurality, and a first pressing member and a first adjusting unit are disposed on the right side of the driving unit and a second pressing member and a second adjusting unit are disposed on the left side of the driving unit; and the limit switch is provided in plurality, and a first limit switch is installed to correspond with one of the first and second adjusting units, and the second limit switch is installed to correspond with another of the first and second adjusting units.

26. The image display device of claim 25, wherein the first limit switch is disposed to contact a clicker corresponding to one of the first and second adjusting units when the one of the first and second adjusting units moves close to the driving unit within a first preset range.

27. The image display device of claim 26, wherein the second limit switch is disposed to contact a clicker corresponding to another one of the first and second adjusting units when the another one of the first and second adjusting units moves far from the driving unit out of a second preset range.

* * * * *